United States Patent
Katsuki et al.

(10) Patent No.: US 8,800,141 B2
(45) Date of Patent: Aug. 12, 2014

(54) METHOD FOR FABRICATING MEMS DEVICE AND MEMS DEVICE

(75) Inventors: Takashi Katsuki, Kawasaki (JP); Takeaki Shimanouchi, Kawasaki (JP); Masahiko Imai, Kawasaki (JP); Osamu Toyoda, Kawasaki (JP); Satoshi Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 447 days.

(21) Appl. No.: 13/037,762

(22) Filed: Mar. 1, 2011

(65) Prior Publication Data

US 2011/0216469 A1 Sep. 8, 2011

(30) Foreign Application Priority Data

Mar. 4, 2010 (JP) ................................. 2010-048008

(51) Int. Cl.
*H01G 7/00* (2006.01)

(52) U.S. Cl.
USPC .............. 29/846; 29/825; 29/829; 29/23.35; 29/25.41; 361/748; 335/199; 310/12.03; 310/311; 310/316.01

(58) Field of Classification Search
USPC .............. 29/825, 829, 846, 25.35, 25.41; 361/748; 335/199; 310/12.03, 311, 310/314, 316.01, 316.02, 317
See application file for complete search history.

(56) References Cited

U.S. PATENT DOCUMENTS

| 6,966,110 B2 * | 11/2005 | DeBar et al. ................. 29/890.1 |
| 2005/0242687 A1 | 11/2005 | Kawakubo |
| 2006/0226934 A1 | 10/2006 | Ohguro |

FOREIGN PATENT DOCUMENTS

| JP | 2003-53700 A1 | 2/2003 |
| JP | 2005-235719 A1 | 9/2005 |
| JP | 2005-313276 A1 | 11/2005 |
| JP | 2006-289520 A1 | 10/2006 |

OTHER PUBLICATIONS

Chinese Office Action dated Jan. 8, 2014, in the corresponding Chinese application No. 201110057805.6, with English translation.

\* cited by examiner

*Primary Examiner* — Peter DungBa Vo
*Assistant Examiner* — Jeffrey T Carley
(74) *Attorney, Agent, or Firm* — Kratz, Quintos & Hanson, LLP

(57) ABSTRACT

There is provided a method for fabricating a device, preferably for a micro electro electro mechanical system. The method includes forming a first electrode on a substrate, where the first electrode has a first sloped end at least at one end thereof; forming a sacrificial layer on the first electrode, where the sacrificial layer has a first sloped edge, the first sloped edge and the first sloped end are overlapped each other so that a thickness of the first sloped edge decreases as a thickness of the first sloped end increases; forming a first spacer on the first electrode, where the first spacer has contact with the first sloped edge; forming a beam electrode on the sacrificial layer and the first spacer; and removing the sacrificial layer after the forming the beam electrode.

13 Claims, 12 Drawing Sheets

METHOD FOR FABRICATING MEMS DEVICE AND MEMS DEVICE

CROSS-REFERENCE TO RELATED APPLICATION

This application is based upon and claims the benefit of priority of the prior Japanese Patent Application No. 2010-048008, filed on Mar. 4, 2010 the entire contents of which are incorporated herein by reference.

FIELD

The present embodiments according to the invention relates to a method for fabricating a device such as a microstructure device and a device, such as the microstructure device, fabricated by the method.

BACKGROUND

Micromachining technology has been developed to fabricate microstructure devices which are recently applied in various fields. The micromachining technology is referred to as micro electro mechanical systems technology (MEMS technology) and the microstructure devices also referred to as MEMS devices.

A mobile communication device such as a mobile phone is an example of the fields as the application of the MEMS technology. MEMS technology makes MEMS devices such as variable capacitors and switches as radio frequency devices (RF devices) suitable to be used in radio-frequency circuits in the mobile phone, for example.

The variable capacitors and the switches in MEMS devices, often need a beam structure which gives a function permitting vertical movement on a substrate on which the MEMS device is formed.

The beam structures having the above-mentioned function are described in Japanese Laid-open Patent Publications No. 2005-313276 and No. 2006-289520. There is described in the former Patent Publication that the MEMES device has a piezoelectric film disposed over a cavity formed in a substrate, a movable beam having a first electrode disposed at the central part of the piezoelectric film, and a second electrode disposed in the cavity so as to face the first electrode.

There is described in the latter patent application that MEMS device has a lower electrode disposed at the bottom of a cavity, an actuator disposed over or inside the cavity, and an upper electrode connected to the actuator.

SUMMARY

According to an aspect of the invention, a method for fabricating a device includes forming a first electrode on a substrate, where the first electrode has a first sloped end at least at one end thereof; forming a sacrificial layer on the first electrode, where the sacrificial layer has a first sloped edge and the first sloped edge and the first sloped end are overlapped each other so that a thickness of the first sloped edge decreases as a thickness of the first sloped end increases; forming a first spacer on the first electrode, where the first spacer has contact with the first sloped edge; forming a beam electrode on the sacrificial layer and the first spacer; and removing the sacrificial layer after the forming the beam electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
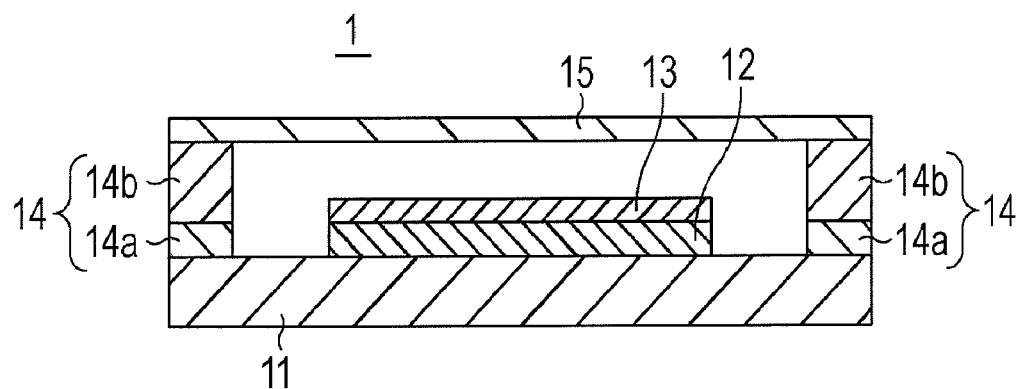
FIGS. 1A and 1B are diagrams schematically illustrating a structure of a MEMS device in this embodiment.

A MEMS device which has been known may usually have a structure in which a second electrode as a movable beam is provided above a first electrode. The first electrode serves for supporting the second electrode or for energizing the second electrode. As layers are sequentially formed during MEMS device fabrication, the second electrode is formed on a resultant uneven surface of a layer over the first electrode.

In order to prevent occurrence of stress concentration or other undesirable effect in a movable beam, it is preferable to form the movable beam on a flat surface as much as possible. For forming the flat surface, it is usually adopted that a sacrificial layer is formed flat by spin coating a resin material such as a resist and a layer to be the movable beam is deposited on the sacrificial layer. By removing the sacrificial layer after patterning the sacrificial layer with a material to be formed to the movable beam, the movable beam is formed above a cavity which has been occupied by the sacrificial layer.

If a resin is used as a sacrificial layer material, a thermal characteristic of the resin imposes various restrictions on processes before removing the sacrificial layer. Therefore, a heating and a lift-off processes are difficult to be applied to the processes.

Instead of the resin material, an adoption of a silicon (Si) material as the sacrificial layer material makes it possible to apply the heating and the lift-off processes more freely in the MEMS device fabrication processes due to the high melting point of the silicon material.

Forming the sacrificial layer with the silicon material may introduce a process such as spattering or another operation for growing silicon crystal to a desired thickness on a substrate. As silicon crystal grows easily, fine irregularities on the substrate, on which a silicon layer will be formed, are duplicated so as to emphasize during layer forming process by growing the Si crystal. Accordingly, the resultant Si sacrificial layer frequently has a surface including emphasized irregularities. A portion at which a wall intersects with the substrate at an angle may also function like the irregularity on the substrate surface because the Si crystal grows from on both the wall and the substrate to form a resultant recess at a boundary of both the grown Si crystals.

Since the surface of the sacrificial layer made with Si material tends to be uneven as described above, it is difficult to appropriately form the second electrode serving as a movable beam on the uneven surface.

Therefore, a fabrication method is desired to form with Si material the sacrificial layer of which the surface is flat as much as possible to appropriately form a second electrode as a movable beam thereon.

According to the present invention, even if silicon is used as a sacrificial layer material, the surface of the resulting sacrificial layer may be flattened as much as possible and a second electrode as a movable beam may be appropriately formed on the sacrificial layer.

As an embodiment, a variable capacitor will be described in detail below as a MEMS device.

Figure 1B:
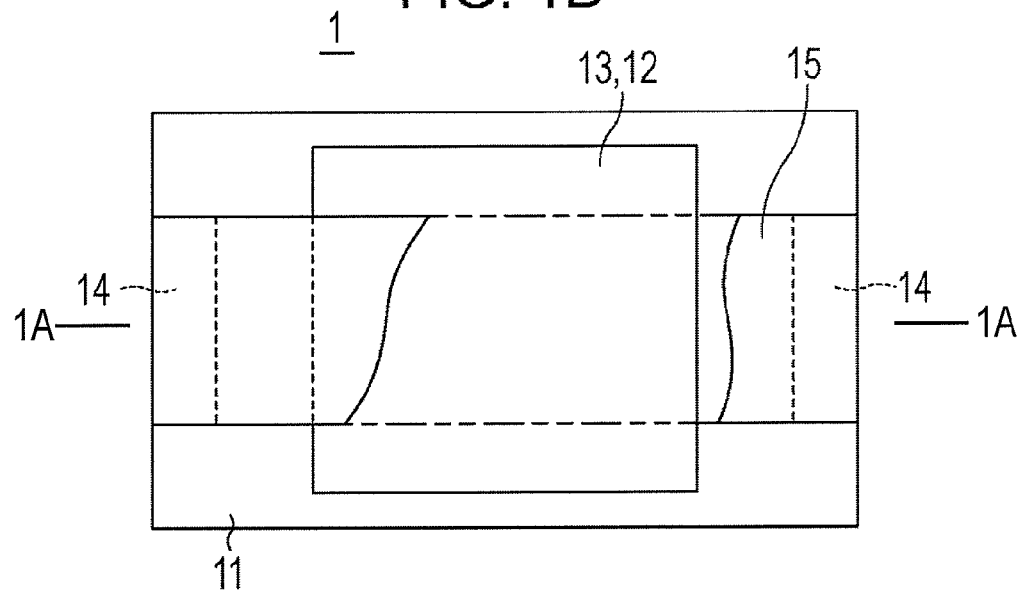

The MEMS capacitor 1 in FIGS. 1A and 1B includes a substrate 11, a fixed electrode 12, a dielectric layer 13, supports 14, and a movable electrode 15. FIG. 1A is a section view taken along the line 1A-1A in FIG. 1B which illustrates a plan view of the MEMS capacitor 1.

The MEMS capacitor 1 has the fixed electrode 12 and movable electrode 15 which are disposed on the substrate 11. The movable electrode 15 warps when an electrostatic attractive force is generated by a voltage applied between the fixed electrode 12 and the movable electrode 15, and the capacitance therebetween will be changed. The movable electrode 15 is just an example of a movable beam.

The dielectric layer 13 increases the capacitance between the fixed electrode 12 and the movable electrode 15 to $\in r$ times more than that in vacuum ($\in r$ is the dielectric constant of the dielectric layer 13), ands also prevents a short-circuit therebetween.

The supports 14, each of which has a base electrode 14a and a spacer 14b, are disposed so as to support both ends of the movable electrode 15. Specifically, each support 14 is disposed at the root of the movable electrode 15. The base electrodes 14a are a base for both the movable electrode 15 and the supports 14.

A glass substrate, a Si substrate having a thermally oxidized film, or the like is used as the substrate 11. The fixed electrode 12, the base electrodes 14a, and the movable electrode 15 are formed of gold, copper, aluminum, or another metal material. The spacers 14b are also made of aluminum, copper, gold, or another metal material.

Various structures other than the structure illustrated in FIGS. 1A and 1B may also be used for the MEMS capacitor 1.

Figure 2:
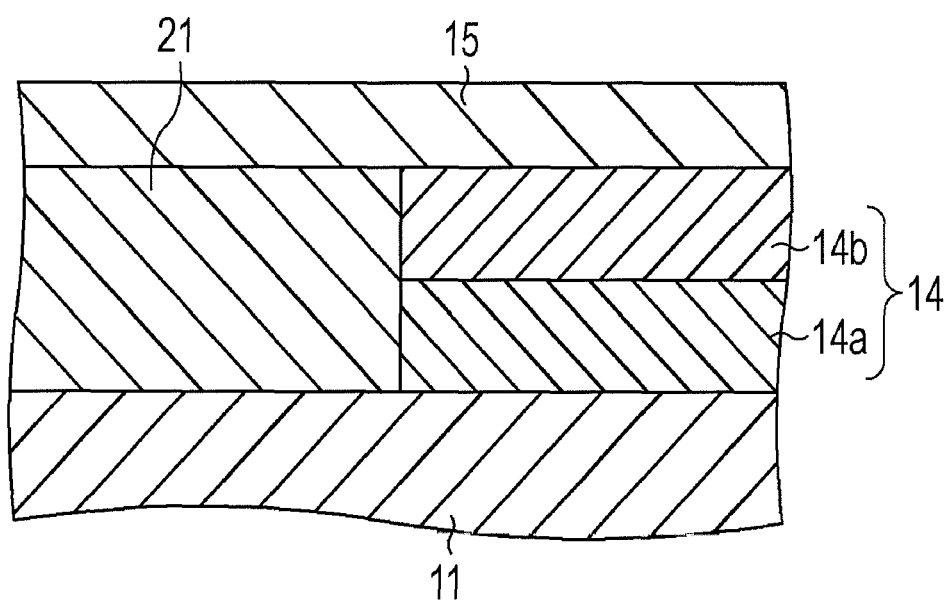
FIG. 2 is a diagram illustrating an exemplary structure of a movable electrode in a step in a MEMS device fabrication process.

FIG. 2 is an enlarged view of a portion around the support 14 on the right side of the MEMS capacitor 1 in FIG. 1A. The support 14 on the left side of the MEMS capacitor 1 is substantially symmetric to the support 14 on the right side in FIG. 2. The base electrodes 14a on the right and left sides are formed at the same time, and the spacers 14b on the right and left sides are also formed at the same time.

As illustrated in FIG. 2, the movable electrode 15 is supported on the substrate 11 by supports 14, each of which includes the base electrode 14a and spacer 14b, at both ends.

During fabrication of the MEMS capacitor 1, the base electrodes 14a, spacers 14b, and sacrificial layer 21 are formed by, for example, patterning or lifting-off process. Then, the movable electrode 15 is formed on the spacers 14b and sacrificial layer 21 by, for example, sputtering or lifting-off process. When the sacrificial layer 21 is removed, a cavity is formed under the movable electrode 15.

Next, the method of fabricating the MEMS capacitor 1 will be described, centered around the supports 14 and sacrificial layer 21 adjacent to them for the clarity of description.

FIGS. 3A to 3C to FIGS. 6A to 6C illustrate fabrication processes for the part illustrated in FIG. 2. To clearly illustrate the shape of each part, FIGS. 3A to 3C to FIGS. 6A to 6C are laterally larger than those in FIGS. 1A and 1B and FIG. 2.

Figure 3A:
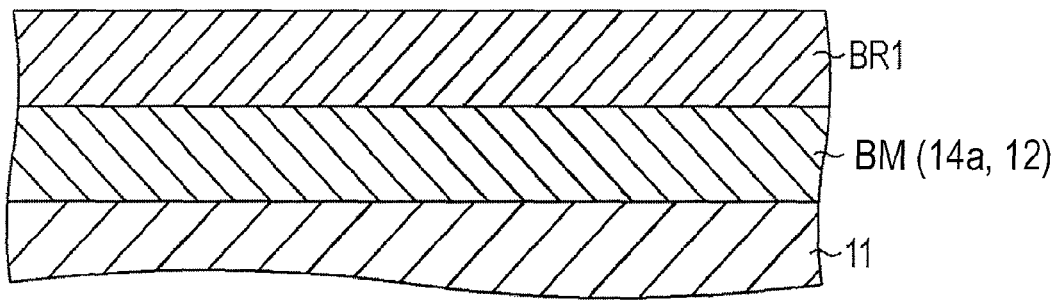
FIGS. 3A to 3C are diagrams illustrating illustrate steps in the MEMS device fabrication process.

As illustrated in FIG. 3A, an electrode layer BM, from which the fixed electrode 12 and base electrodes 14a will be formed, is formed on the substrate 11 by spattering or plating by use of gold, copper, aluminum, or the like. The thickness of the electrode layer BM is 0.5 to several micrometers, for example. A resist BR1 is then applied to the electrode layer BM.

Figure 3B:
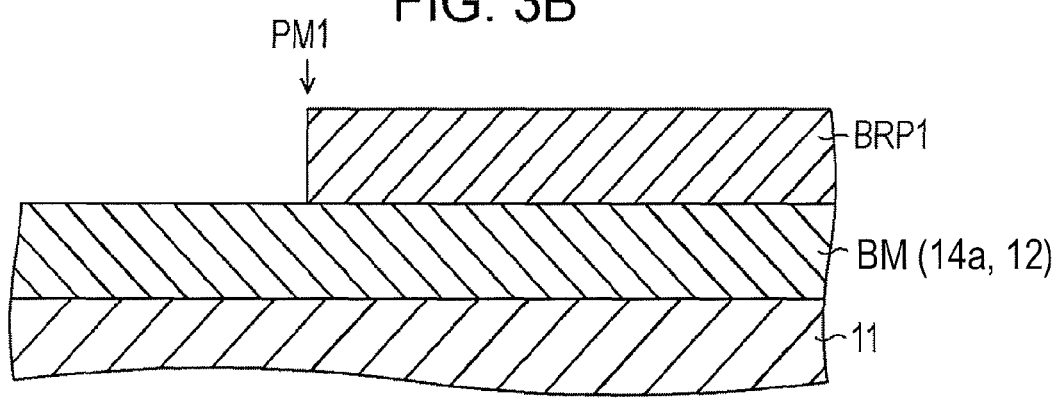

As illustrated in FIG. 3B, the resist BR1 is patterned to form a patterned resist BRP1. In this patterning, the end of a mask M1, which is not illustrated, for forming the base electrode 14a is aligned to a mask position PM1. The mask M1 will be illustrated in FIG. 7A.

The mask position PM1 is nearer to the center of the MEMS capacitor 1 than a mask position PM2 described later. Accordingly, the resist BRP1 to the right of the mask position PM1 is left, and the base electrode 14a will be patterned by the resist BRP1.

Figure 3C:
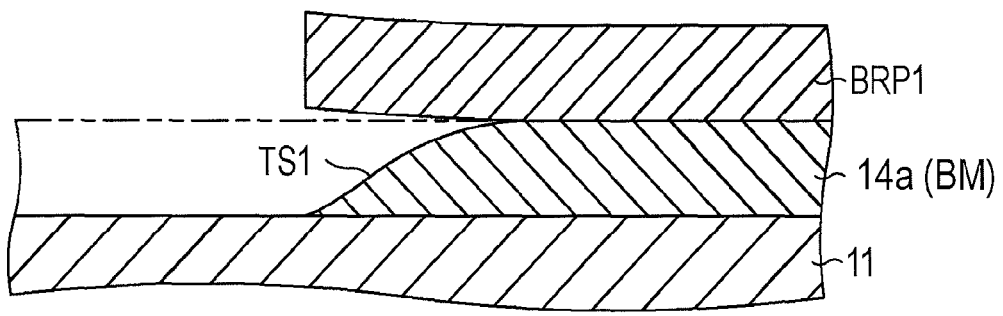

Specifically, as illustrated in FIG. 3C, an appropriate etchant is used to etch the electrode layer BM, forming the base electrode 14a. That is, the electrode BM includes a portion uncoated and a portion coated with the resist BRP1. After etching process using the appropriate etchant, the portion coated with the resist BRP1 is left to form resultantly the base electrode 14a after several processes.

Using a liquid including an appropriate surfactant as the etchant during the etching process, the etchant enters between the resist BRP1 and electrode layer BM. Accordingly a portion of the electrode layer BM adjacent to the position PM1 is removed to some extent by the etchant as illustrated in FIG. 3B to form a sloped side wall TS1 having a relatively gentle inclination at its ends.

The leftmost end of the sloped side wall TS1 is substantially the same as the mask position PM1. The base electrode 14a and fixed electrode 12 at the other end are also formed at the same time. It suffices to form the dielectric layer 13 in an appropriate process after the fixed electrode 12 was formed.

After the resist BRP1 was removed, a new resist BR2 is applied. The applied resist BR2 is then patterned to form a patterned resist BRP2 as illustrated in FIG. 4A.

The resist BRP2 is patterned to lift off a sacrificial layer later. The end of a mask M2 used for this patterning of the resist BRP2 is aligned to a mask position PM2. Accordingly, the resist BRP2 to the right of the mask position PM2 is left.

Figure 4A:
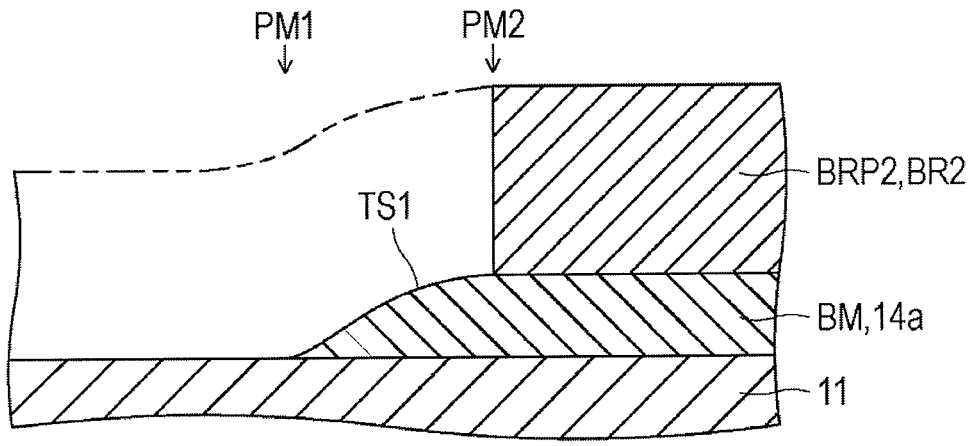
FIGS. 4A to 4C are diagrams illustrating steps in the MEMS device fabrication process.

The mask position PM2 is to the right of the mask position PM1 as illustrated in FIG. 4A, and is near the vertex of the sloped side wall TS1 of the base electrode 14a or at a position in a flat part to the right of the vertex.

Figure 4B:
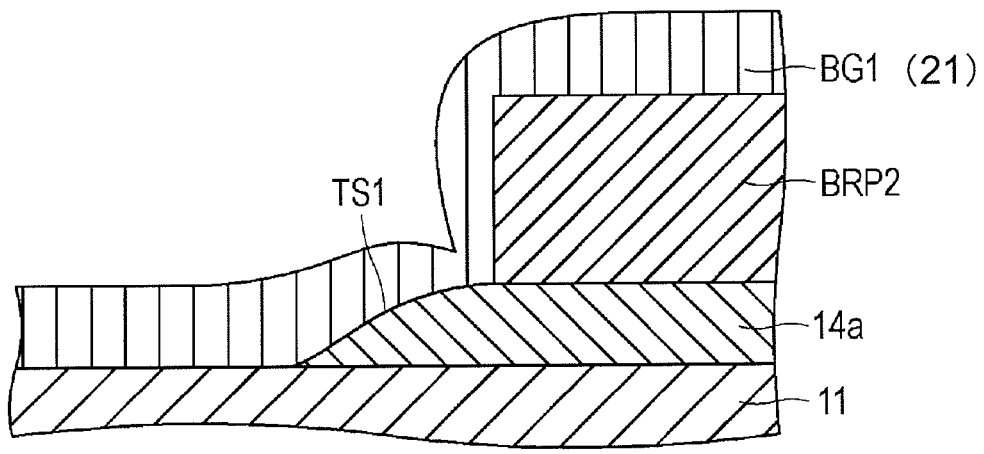

Next, a first sacrificial layer BG1 is formed by spattering or the like on the base electrode 14a formed on the substrate 11 and resist BRP2 formed on the base electrode 14a, as illustrated in FIG. 4B. In this embodiment, silicon (Si) is used as the material of the first sacrificial layer BG1. In this case, the thickness around a portion of which the first sacrificial layer BG1 contacts with the substrate 11 is preferably as same as the thickness of the flat portion of the base electrode 14a.

Figure 4C:
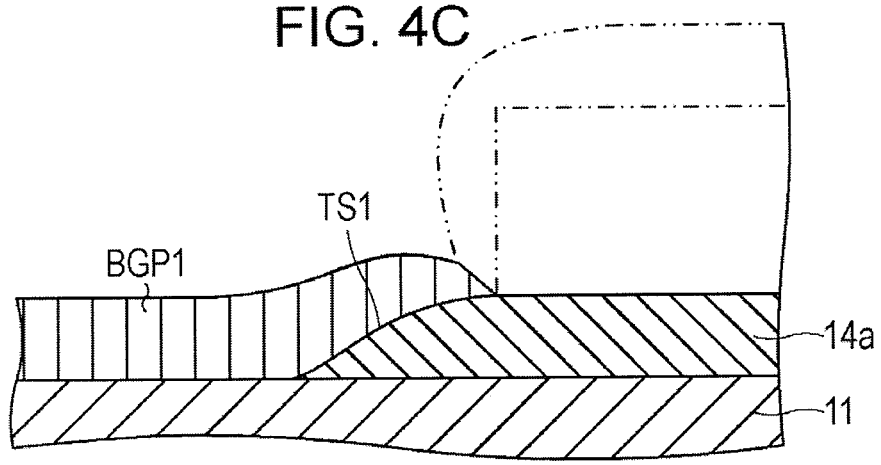

The resist BRP2 is then lifted off together with the first sacrificial layer BG1 formed thereon. A first patterned sacrificial layer BGP1 is thereby formed by the lift-off, as illustrated in FIG. 4C.

Figure 5A:
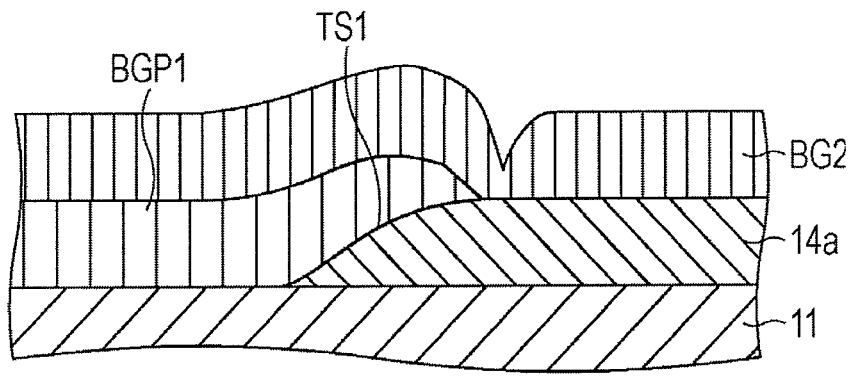
FIGS. 5A to 5C are diagrams illustrating steps in the MEMS device fabrication process.

A second sacrificial layer BG2 is further formed by spattering or the like on the first patterned sacrificial layer BGP1 and base electrode 14a, as illustrated in FIG. 5A. The thickness of a flat portion of the second sacrificial layer BG2 is such that its upper surface is at the same height as the lower surface of the movable electrode 15, which will be formed later. A resist BR3 is then applied on the second sacrificial layer BG2 as indicated by solid lines and a dash-dot-dot line in FIG. 5B.

Figure 5B:
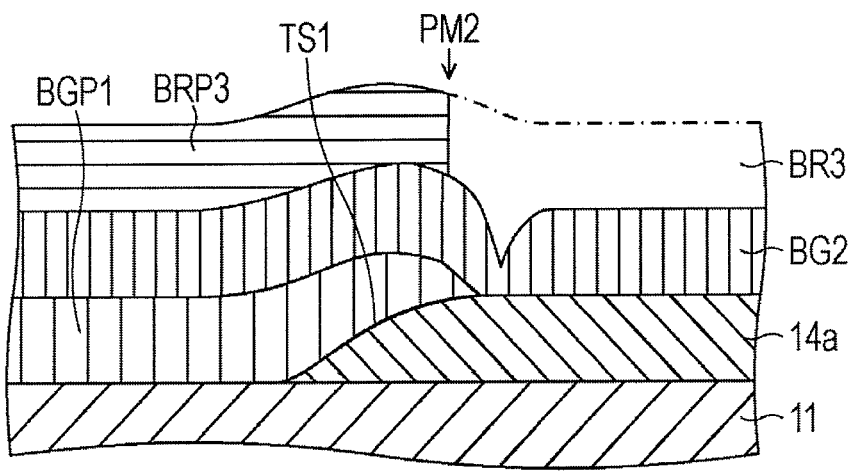

The applied resist BR3 is patterned to form a patterned resist BRP3 as indicated by solid lines in FIG. 5B. The end of a mask M3 used for this patterning of the resist BRP3 is aligned to the mask position PM2 as in the case of the mask M2. Accordingly, the resist BRP3 to the left of the mask position PM2 is left.

Figure 5C:
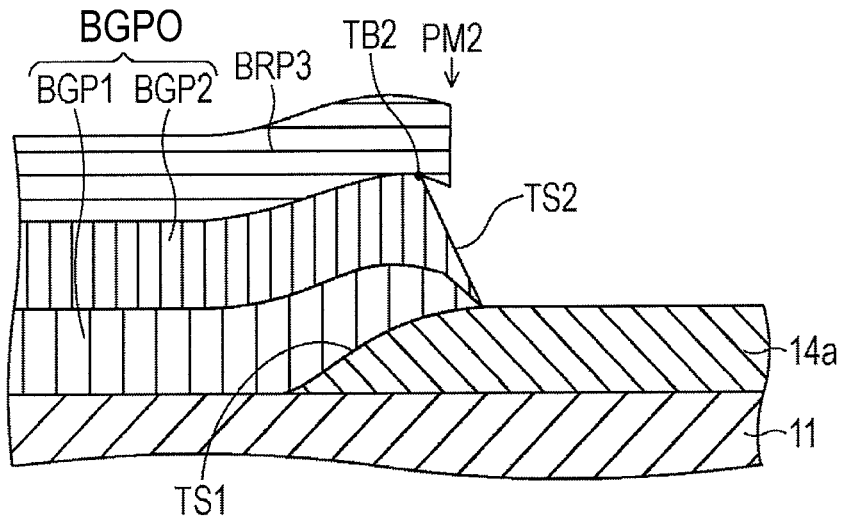

Next, the second sacrificial layer BG2 is patterned by, for example, dry etching. A second patterned sacrificial layer BGP2 is thereby formed as illustrated in FIG. 5C. At least the second patterned sacrificial layer BGP2 is undercut by etching, with respect to the resist BRP3. A sloped end surface TS2 is formed at the end of the undercut part. The sloped end surface TS2 inclines in a direction opposite to the direction in which the sloped side wall TS1 of the base electrode 14a inclines.

That is, the first patterned sacrificial layer BGP1 and second patterned sacrificial layer BGP2 are combined to form a sacrificial layer BGP0 (21) as a whole. The sacrificial layer BGP0 extends from an area in which the base electrode 14a is not formed and overlaps the sloped side wall TS1 of the base electrode 14a, with the sloped end surface TS2 being formed at the end.

The sloped end surface TS2 of the sacrificial layer BGP0 is formed above the sloped side wall TS1 of the base electrode 14a as illustrated FIG. 5C. Therefore, the angle of the sloped end surface TS2 with respect to the surface of the substrate 11 is smaller than when the sloped end surface TS2 is formed on a surface parallel to the surface of the substrate 11, enabling the inclination of the sloped end surface TS2 to be gentle.

Figure 6A:
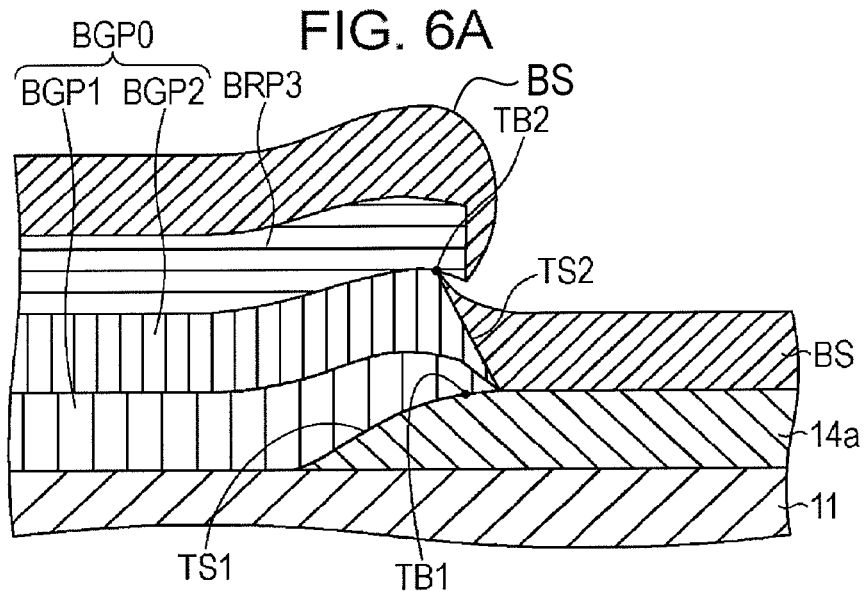
FIGS. 6A to 6C are diagrams illustrating steps in the MEMS device fabrication process.

Next, a spacer layer BS used to form the spacer 14b is formed by, for example, sputtering as illustrated in FIG. 6A. The thickness of the spacer 14b is such that its upper surface is at the same height as the lower surface of the movable electrode 15, which will be formed later, that is, at the same height as the upper surface of the sacrificial layer BGP0.

Figure 6B:
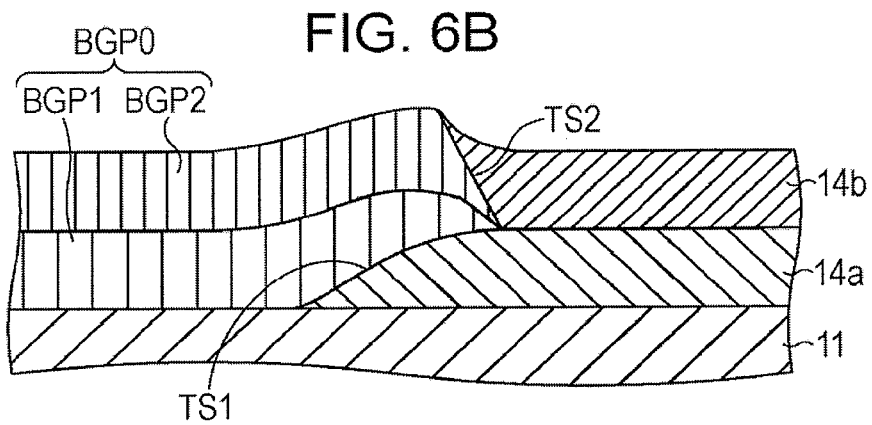

The resist BRP3 is then lifted off together with the spacer layer BS formed thereon. The spacer 14b is thereby formed as illustrated in FIG. 6B. The end surface of the spacer 14b touches or contacts the sloped end surface TS2 of the sacrificial layer BGP0.

Accordingly, the mask M3 functions as a mask for sacrificial layer BGP0 etching and as a mask for the lifting-off of the spacer 14b.

Figure 6C:
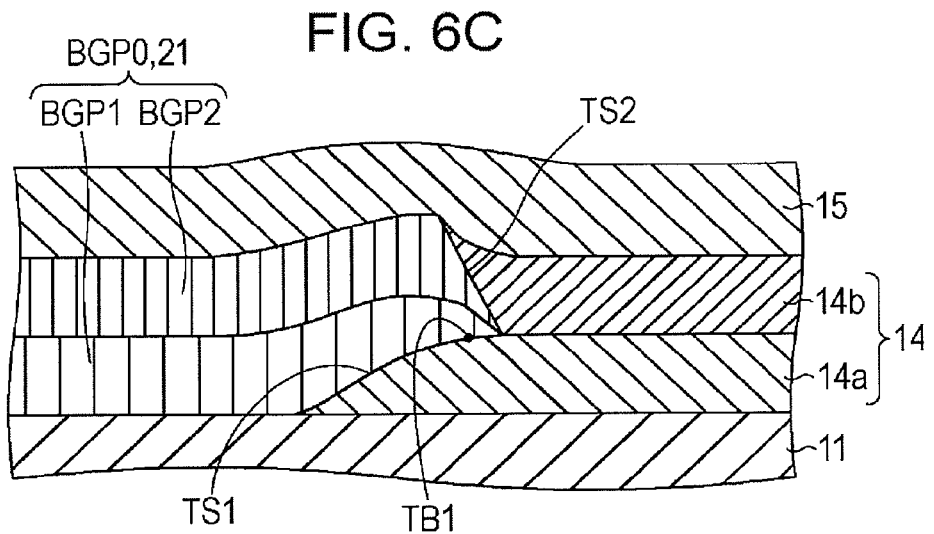

Next, the movable electrode 15 is formed on the spacer 14b and sacrificial layer BGP0 by, for example, sputtering or lifting-off as illustrated in FIG. 6C. When the sacrificial layer BGP0 is removed, a cavity is formed under the movable electrode 15.

Figure 7A:
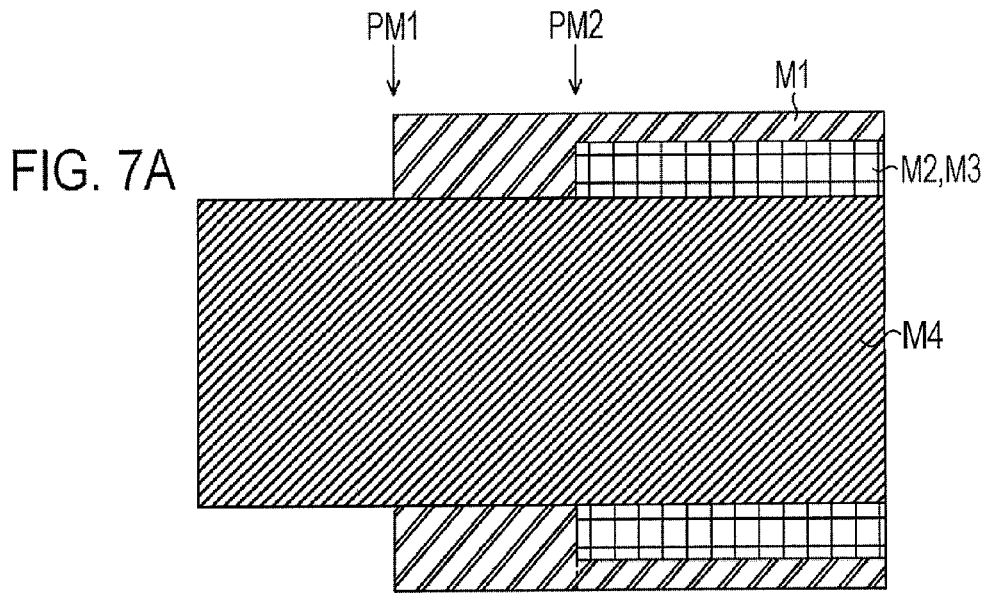
FIG. 7A is a diagram illustrating a positional relationship between masks.
Figure 7B:
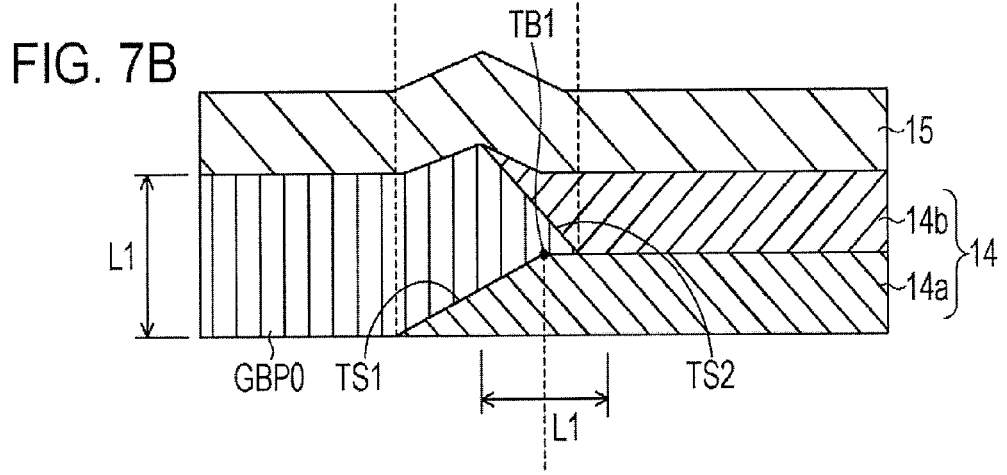
FIG. 7B is a diagram illustrating a positional relationship between the layers.

FIG. 7A illustrates a positional relationship between the masks M1 to M4, and FIG. 7B illustrates a positional relationship between layers patterned by the masks M1 to M4, where the mask M4 functions for patterning forming of the movable electrodes 15.

In FIG. 7A, the mask M1 used to pattern the base electrode 14a is disposed at the mask position PM1, while the mask M2 used to pattern the first sacrificial layer BGP1 and the mask M3 used to pattern the sacrificial layer BGP0 21 and spacer 14b are disposed at the mask position PM2.

The mask M1 and the masks M2, M3 are disposed so that the edges patterned using them are disposed at different positions as illustrated in FIG. 7A. Therefore, as illustrated in FIG. 7B, the sacrificial layer BGP0 is formed so that at least part of the sloped end surface TS2 of the sacrificial layer BGP0 matches a position within the range of a width as same as the thickness L1 of the sacrificial layer BGP0, where the center of the range is the vertex TB1 of the sloped side wall TS1 of the base electrode 14a.

It is preferable to form the sacrificial layer BGP0 so that the vertex TB2 of the sloped end surface TS2 of the sacrificial layer BGP0 is disposed above the sloped side wall TS1 of the base electrode 14a as illustrated in FIG. 6A. However, this is not necessarily so.

When the sacrificial layer BGP0 is formed by disposing the masks M1 to M3 as described above, irregularities on the surface of the sacrificial layer BGP0 are lessened and an adequately flat surface may be obtained. Accordingly, the movable electrode 15 formed on the sacrificial layer BGP0 and spacer 14b is appropriately shaped, enabling the movable electrode 15 to have an enough strength and thereby may perform fully its function.

Now, a case in which a MEMS device is fabricated with the masks 1 to 3 disposed at the same position will be described for comparison with the fabrication method in this embodiment.

Figure 8A:
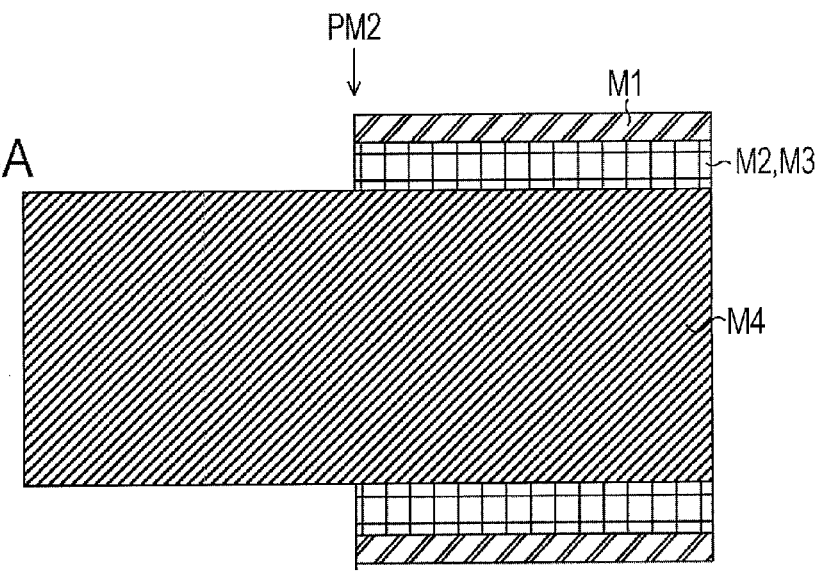
FIG. 8A is a diagrams illustrating another positional relationship between masks.

In the comparison example, the three masks M1 to M3 are all disposed at the same mask position PM2, as illustrated in FIG. 8A, which is a diagram illustrating a plan view for explaining the positional relationship among the masks. FIG. 8A is a diagram illustrating a sectional view, taken along the line B-B in FIG. 8A, of a laminated structure including the base electrode 14aj, the sacrificial layer BGP0j, the spacer 14bj, and the movable electrode 15j. Operations other than disposing the masks M1 to M3 are the same as in this embodiment described above.

Figure 8B:
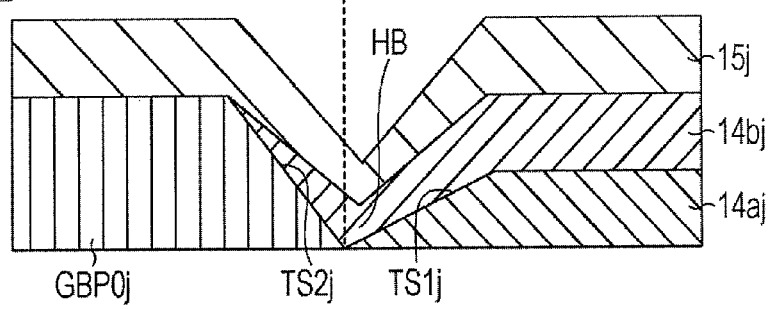
FIG. 8B is a diagrams illustrating a positional relationship between the layers.

The sloped side wall TS1j is formed at the end of the base electrode 14aj as in the embodiment of the present invention. Accordingly, the end of the sloped side wall TS1j is disposed at almost near to the position as the mask position PM2 (see FIG. 8B). Since the sacrificial layer BGP0j does not overlap the sloped side wall TS1j of the base electrode 14aj, a large V-shaped groove HB is resultantly formed between the sacrificial layer BGP0j and sloped side wall TS1j. Therefore, as the spacer 14bj is formed along the groove HB, a similar groove is formed.

As a result, the movable electrode 15j formed on the spacer 14bj has an inappropriate shape that is largely V-shaped by the groove generated near the mask position PM2. The strength of the movable electrode 15j may be then weakened and its function may not be fully executed with ease.

Figure 9A:
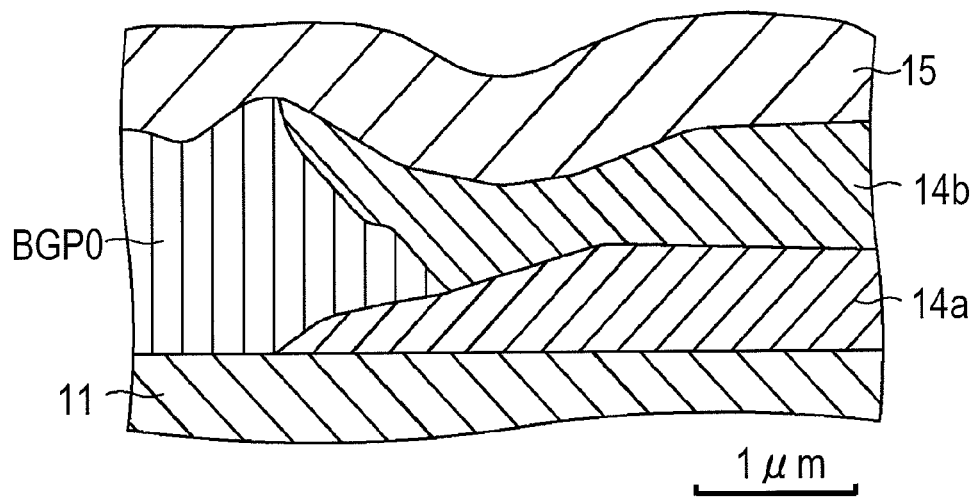
FIGS. 9A and 9B are diagrams illustrating cross sectional views of experimentally fabricated MEMS devices around movable electrodes, which were drawn on the basis of their photos.
Figure 9B:
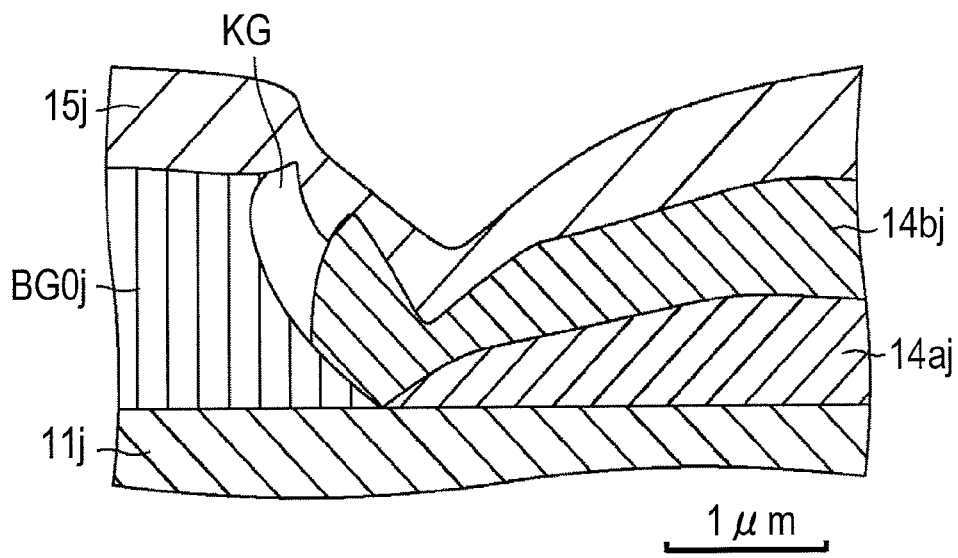

FIGS. 9A and 9B are cross sectional views of experimentally fabricated movable electrodes 15 and 15j, which were drawn on the basis of their photos.

As illustrated in FIG. 9A, in the fabrication based on the method in the present embodiment according to the invention, the surface of the sacrificial layer BGP0 was considerably flat, and thereby the movable electrode 15 formed on the sacrificial layer BGP0 could be appropriately flattened.

When the three masks M1 to M3 were all disposed at the same mask position PM2, however, the movable electrode 15j was V-shaped with a large groove as illustrated in FIG. 9B, and may not have an appropriate flat shape.

When the three masks M1 to M3 are all disposed at the same mask position PM2 as described above, the sacrificial layer BGP0j does not overlap the sloped side wall TS1j of the base electrode 14aj. Therefore, when the sacrificial layer BGP0j is formed, it is deposited directly on the surface of the substrate 11, and its sloped end surface TS2j becomes significantly abrupt, that is, nearly vertical.

As a result, a void KG (see FIG. 9B), which was not filled with a spacer material, was generated between the sacrificial layer BGP0j and spacer 14bj, preventing the movable electrode 15j from being appropriately shaped.

By contrast, in the method in this embodiment, the mask position PM1, at which the mask M1 used to form the base electrode 14a is disposed, is different from the mask positions PM2, at which the other masks M2 and M3 are disposed, so that the sloped side wall TS1 of the base electrode 14a extends outside the spacer 14b.

Specifically, as described above, the sloped side wall TS1 of the base electrode 14a is formed so as to externally extend and then the sacrificial layer BGP0 is formed so as to overlap the sloped side wall TS1. At least part of the sloped end surface TS2 of the sacrificial layer BGP0 preferably matches a position within the range of the thickness L1 of the sacrificial layer BGP0, the center of which is the vertex TB1 of the sloped side wall TS1. The masks M1 to M3 are designed so that the mask position PM2 has an adjustment margin as described above.

When the sacrificial layer BGP0 is formed on the sloped side wall TS1 in this way, the sacrificial layer BGP0 overlaps the sloped side wall TS1, and thereby the inclination of the sloped end surface TS2 of the sacrificial layer BGP0 becomes gentle. The void KG or a similar void was not generated between the sacrificial layer BGP0 and spacer 14b as illustrated in FIG. 9A.

Specifically, the side wall at the end of the spacer 14b was formed so that it was placed in tight contact with the entire sloped end surface TS2 of the sacrificial layer BGP0. Therefore, the sacrificial layer BGP0 formed a continuous surface with the spacer 14b, which was placed beneath the movable electrode 15, enabling the movable electrode to be flatly shaped. The strength of the movable electrode 15 may be thereby maintained.

If the sloped end surface TS2 of the sacrificial layer BGP0 extends upward at an intermediate point on the sloped side wall TS1 of the base electrode 14a, the inclination of the sloped end surface TS2 may be made further gentle. This suppresses expansion of the sloped end surface TS2 at its vertex, and thereby enables the movable electrode 15 to be further flattened.

In the method in this embodiment described above, silicon may be used as the material of the sacrificial layer 21, therefore, temperature restrictions on processes may be significantly reduced. Accordingly, for example, substrate temperature during formation of the movable electrode 15 may be changed, and freedom in design may be largely improved for internal stress and warp after it is released.

By comparison, if a resin is used as the material of the sacrificial layer, various restrictions are imposed on fabrication processes; process temperature is limited to a maximum of about 100° C. until the sacrificial layer is removed. However, the use of a resin as the material of the sacrificial layer 21 is not inhibited.

Although one of the two supports 14 disposed at both ends of the movable electrode 15 has been described so far, the two supports 14 are formed in the same process at the same time, as described above.

For example, the two base electrodes 14a are formed so that each of their ends, which mutually oppose with a spacing therebetween, becomes the sloped side wall TS1. The sacrificial layer BGP0 is formed so that it develops from an area between the sloped side walls TS1 of the two base electrodes 14a and overlaps the sloped side walls TS1 of the two base electrodes 14a. At this time, the sloped end surface TS2 is formed at each end of the sacrificial layer BGP0.

The spacers 14b are formed on the two base electrodes 14a so that the spacers 14b abut against the relevant sloped end surfaces TS2 of the sacrificial layer BGP0.

Figure 10:
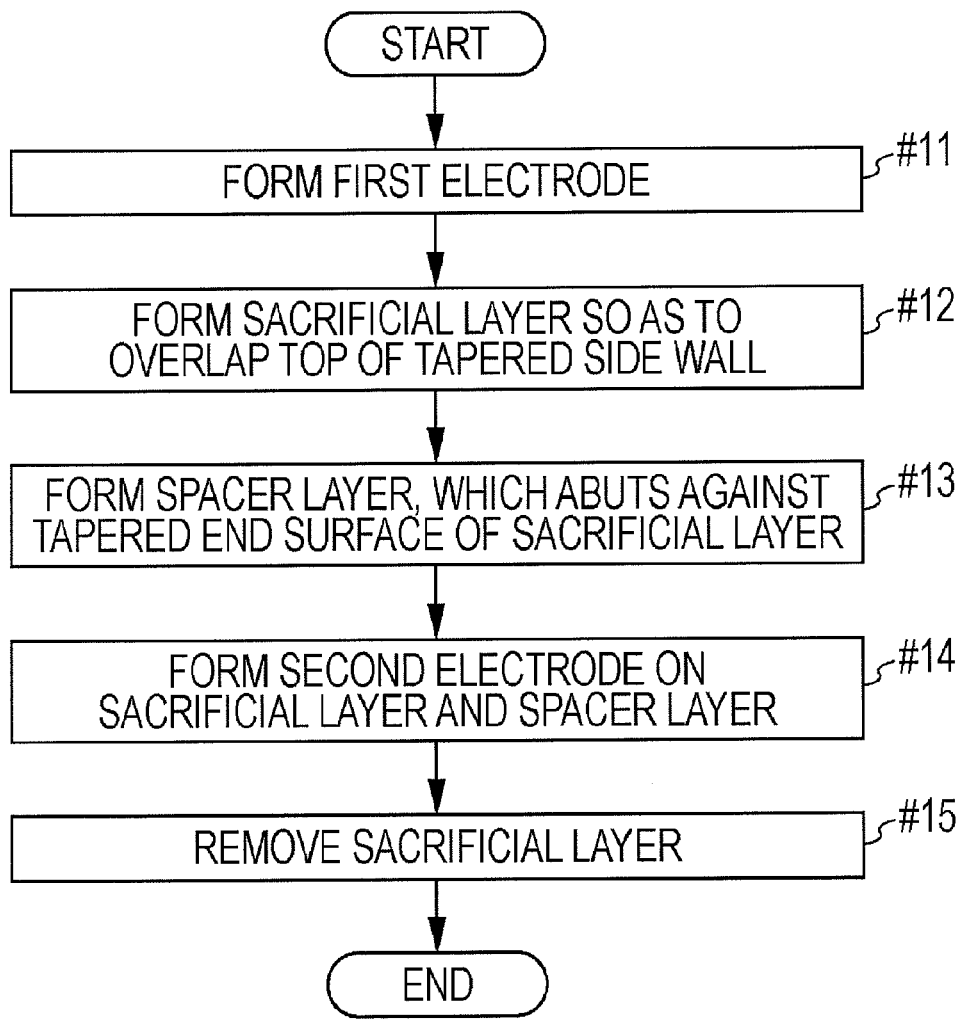
FIG. 10 is a flowchart schematically illustrating fabrication processes in this embodiment.

Next, the fabrication method in this embodiment will be described with reference to the flowchart in FIG. 10.

First, the base electrode 14a having the sloped side wall TS1 at its end is formed on the substrate 11 (step #11). The fixed electrode 12 is also formed at the same time. The sacrificial layer BGP0 is then formed so that it extends from an area in which the base electrode 14a is not formed and overlaps the sloped side wall TS1 of the base electrode 14a, with the sloped end surface TS2 being formed at the end, the sloped end surface TS2 inclining in a direction opposite to the direction in which the sloped side wall TS1 inclines (step #12).

The spacer layer BS (spacer 14b), which abuts against the sloped end surface TS2 of the sacrificial layer BGP0, is formed on the base electrode 14a (step #13). The movable electrode 15 is formed on the sacrificial layer BGP0 and spacer 14b (step #14). After the movable electrode 15 has been formed, the sacrificial layer BGP0 is removed (step #15).

In the embodiment described above, the materials, shapes, dimensions, fabrication methods, and fabrication processes of the substrate 11, fixed electrode 12, dielectric layer 13, spacer 14b, and movable electrode 15 are not limited to those described above, but other various forms may be used. The method of fabricating the sacrificial layer BGP0 is not also limited to that described above, but various other methods may be used.

In the embodiment described above, the MEMS capacitor 1 has been taken as an example to describe a method of fabricating it. However, a MEMS capacitor having a different structure may also be used. For example, a structure in which the drive electrode for driving the movable electrode 15 is disposed separately from the fixed electrode 12 may be used. In addition to MEMS capacitors, the embodiment may also be applied to MEMS switches, radio-frequency filters, and other MEMS devices.

Figure 11A:
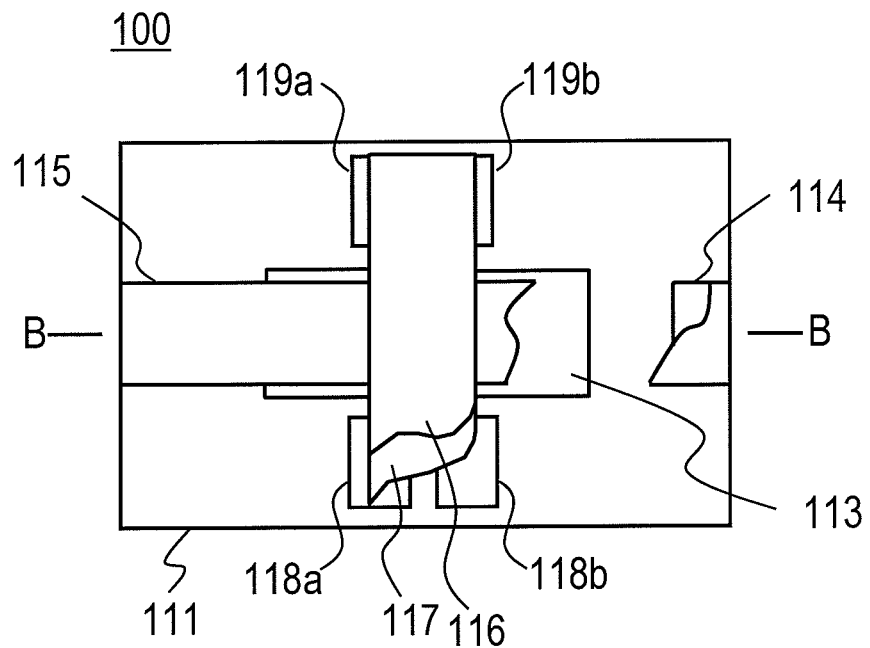
FIGS. 11A and 11B are diagrams illustrating a MEMS switch having the movable electrode.
Figure 11B:
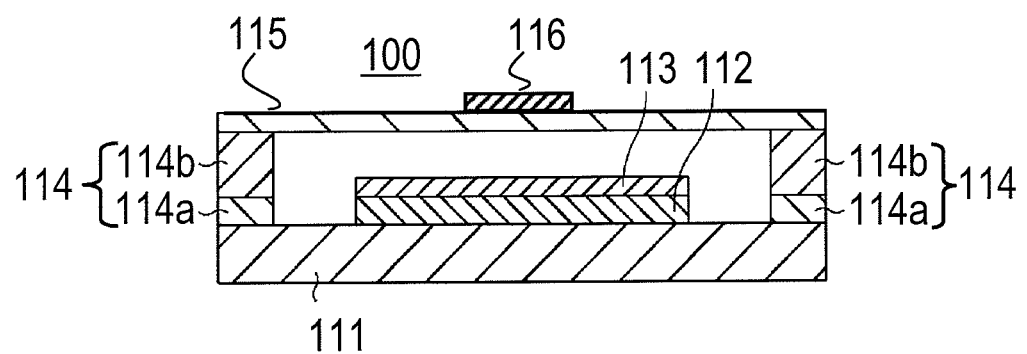

FIG. 11A is a plan view of an example of the MEMS switch which is fabricated by a method similar to the method used in the fabrication of the MEMS capacitor illustrated in FIGS. 1A and 1B. FIG. 11B is a diagram illustrating a sectional view taken along the B-B line in FIG. 11A. Each material of a substrate 111, a fixed electrode 112, a dielectric layer 13, a base electrode 114a, a spacer 114b and a movable electrode 115 is similar to each material of the substrate 11, the fixed electrode 12, the dielectric layer 13, the base electrode 14a, the spacer 14b and the movable electrode 15, respectively. On the movable electrode 115, dielectric layer 116 is disposed and at the both ends thereof, contacts 117 made of metal are provided. Opposing to each of the contacts 117, two pair of contact electrodes are formed, one includes contact electrodes 118a and 118b, the other contact electrodes 119a and 119b. These contacts and the contact electrodes are made of metal. The movable electrode 15 is bent to the dielectric layer 113 by electrostatic force induced between the movable electrode 115 and the dielectric layer 113 when electric potential is applied between fixed electrode 112 and the movable electrode 115. The thicknesses of the contact electrodes 118a, 118b, 119a, and 119b are the same to or slightly larger than the height of the dielectric layer 113 from the surface of the substrate 111. Accordingly, each pair of contact electrodes 118a and 118b, and 119a and 119b are electrically switched on or off depending on whether the movable electrode 115 is bent to move toward the fixed electrode 112 or not.

Figure 12:
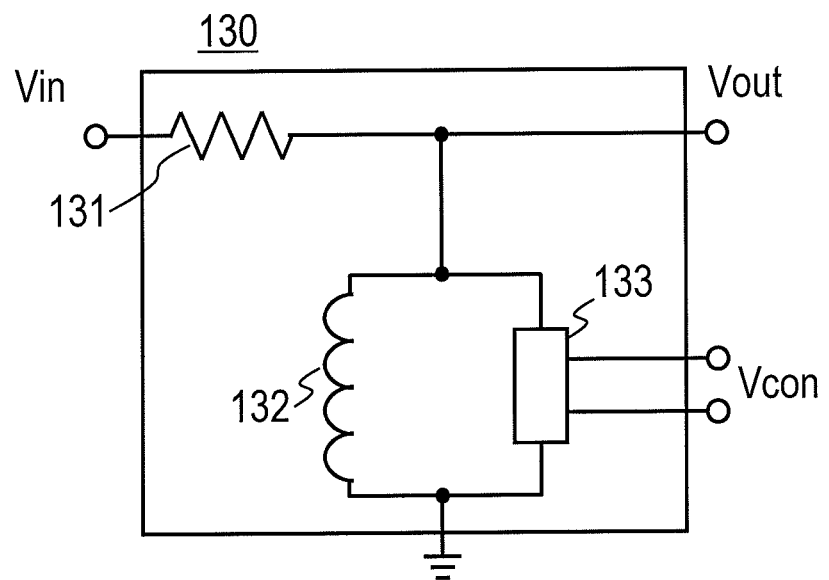
FIG. 12 is a diagram illustrating a MEMS filter in which a MEMS capacitor is included.

FIG. 12 is a diagram illustrating a MEMS filter 130 which composes a resonant circuit. In the MEMS filter 130, an inductor 132 and a MEMS capacitor 133 are coupled in parallel and the MEMS capacitor 133 is controlled by a voltage Vcon which is applied from an external circuit. Capacitance of the MEMS capacitor 133 is controlled by Vcon and the resonant frequency of the MEMS filter 130 may be selected according to Vcon. The MEMS filter 130 illustrated in FIG. 12 is composed with each of the electrical elements, however, it may be possible to fabricate the filter in a package using MEMS technology.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method for fabricating a device, comprising:
   forming a first electrode directly on a substrate, the first electrode having a first sloped end at least at one end thereof;
   forming a sacrificial layer directly on the first electrode, the sacrificial layer including a first sloped edge, the first sloped edge including an outer surface sloping towards a surface of the substrate, the first sloped edge and the first sloped end being overlapped each other so that a thickness of the first sloped edge decreases as a thickness of the first sloped end increases;
   forming a first spacer on the first electrode, the first spacer having direct contact with the first sloped edge;
   forming a beam electrode on the sacrificial layer and the first spacer; and
   removing the sacrificial layer after the forming the beam electrode.

2. The method according to claim 1, wherein a part of the sacrificial layer is disposed on the substrate.

3. The method according to claim 1, wherein the device is used in a micro electro mechanical system.

4. The method according to claim 1, wherein
   a second electrode is formed in the forming the first electrode, the second electrode disposed on the substrate separately from the first electrode,
   the second electrode having a second sloped end which opposes the first sloped end of the first electrode,
   the sacrificial layer is formed so that a second sloped edge of the sacrificial layer overlaps with the second electrode in a manner that a thickness of the second sloped edge decreases as a thickness of the second sloped end increases,
   a second spacer is formed in the forming the first spacer, the second spacer formed on the second electrode and has contact with the second sloped edge.

5. The method according to claim 4, wherein a part of the sacrificial layer is disposed on the substrate.

6. The method according to claim 1, wherein
   an edge of the second sloped end is disposed in an area which has a width equivalent to a thickness of the sacrificial layer, a center position of the width corresponding to a position of a vertex of the first sloped end.

7. The method according to claim 4, wherein
   an end of the second sloped end is disposed in an area which has a width equivalent to a thickness of the sacrificial layer, a center position of the width corresponding to a position of a vertex of the first sloped end.

8. The method according to claim 6, wherein
   the sacrificial layer is formed so that a vertex of the first sloped edge is disposed at a position higher than that of the first sloped end.

9. The method according to claim 7, wherein
   the sacrificial layer is formed so that a vertex of the first sloped edge is disposed at a position higher than that of the first sloped end.

10. The method according to claim 6, wherein
    the sacrificial layer includes a first sacrificial layer and a second sacrificial layer,
    the first sacrificial layer is formed by use of lift-off processing, the second sacrificial layer is formed on the first sacrificial layer by use of etching processing.

11. The method according to claim 7, wherein
    the sacrificial layer includes a first sacrificial layer and a second sacrificial layer,
    the first sacrificial layer is formed by use of lift-off processing,
    the second sacrificial layer is formed on the first sacrificial layer by use of etching processing.

12. The method according to claim 8, wherein
    the sacrificial layer includes a first sacrificial layer and a second sacrificial layer,
    the first sacrificial layer is formed by use of lift-off processing,
    the second sacrificial layer is formed on the first sacrificial layer by use of etching processing.

13. The method according to claim 9, wherein
    the sacrificial layer includes a first sacrificial layer and a second sacrificial layer,
    the first sacrificial layer is formed by use of lift-off processing,
    the second sacrificial layer is formed on the first sacrificial layer by use of etching processing.

* * * * *